US 6,660,457 B1

(12) United States Patent
Imai et al.

(10) Patent No.: US 6,660,457 B1
(45) Date of Patent: Dec. 9, 2003

(54) METHOD OF FORMING CONDUCTIVE PATTERN

(75) Inventors: Genji Imai, Hiratsuka (JP); Hideo Kogure, Atsugi (JP); Daisuke Kojima, Hiratsuka (JP)

(73) Assignee: Kansai Paint Co., Ltd., Amagasaki (JP)

( * ) Notice: Subject to any disclaimer, the term of this patent is extended or adjusted under 35 U.S.C. 154(b) by 0 days.

(21) Appl. No.: 09/831,892

(22) PCT Filed: Nov. 24, 1999

(86) PCT No.: PCT/JP99/06551

§ 371 (c)(1), (2), (4) Date: May 23, 2001

(87) PCT Pub. No.: WO00/31591

PCT Pub. Date: Jun. 2, 2000

(30) Foreign Application Priority Data

Nov. 26, 1998 (JP) ............................................. 10-335629
Dec. 3, 1998 (JP) ............................................. 10-344558

(51) Int. Cl.$^7$ .............................. G03C 5/00; G03C 1/00
(52) U.S. Cl. ....................... 430/315; 430/311; 430/313; 430/323; 430/199
(58) Field of Search ................................. 430/311, 313, 430/323, 198, 299

(56) References Cited

U.S. PATENT DOCUMENTS

| 4,373,019 | A | * | 2/1983 | Watanabe et al. | 427/259 |
|---|---|---|---|---|---|
| 4,959,295 | A | * | 9/1990 | Nebe et al. | 427/96 |
| 5,055,376 | A | * | 10/1991 | Saeva | 430/270.1 |
| 5,200,264 | A | * | 4/1993 | Frentzel | 252/503 |
| 5,906,912 | A | | 5/1999 | Watanabe et al. | |
| 5,958,647 | A | * | 9/1999 | Morgan | 430/270.1 |
| 6,106,999 | A | * | 8/2000 | Ogiso et al. | 430/281.1 |
| 6,337,028 | B1 | * | 1/2002 | Masuko et al. | 430/317 |

FOREIGN PATENT DOCUMENTS

| JP | 50-112764 | 9/1975 |
|---|---|---|
| JP | 63-204724 | 8/1988 |
| JP | 6-132208 | 5/1994 |
| JP | 6-242604 | 9/1994 |
| JP | 9-106080 | 4/1997 |
| JP | 10-273338 | 10/1998 |

* cited by examiner

Primary Examiner—Mark F. Huff
Assistant Examiner—Kripa Sagar
(74) Attorney, Agent, or Firm—Armstrong, Kratz, Quintos, Hanson & Brooks, LLP

(57) ABSTRACT

The present invention provides a method of forming a conductive pattern, comprising the steps of:

(1) depositing a conductive coating-forming resin layer and an energy beam-sensitive coating layer on a substrate in this order;

(2) irradiating a surface of the energy beam-sensitive coating layer with an active energy beam or heat rays directly or through a mask, so as to obtain a desired pattern;

(3) developing the energy beam-sensitive coating layer to form a resist pattern coating from the energy beam-sensitive coating layer; and (4) removing revealed portions of the conductive coating-forming resin layer by development.

The present invention also provides a method of forming a conductive pattern, comprising the step (1), the step (2), and the step of:

(3') developing the energy beam-sensitive coating layer and the conductive coating-forming resin layer simultaneously.

4 Claims, No Drawings

METHOD OF FORMING CONDUCTIVE PATTERN

TECHNICAL FIELD

The present invention relates to novel methods of forming a conductive pattern.

BACKGROUND ART

Photolithography is conventionally utilized for forming conductive patterns on, for example, plastic substrates or inorganic substrates, in production processes of wiring boards, display panels, etc.

A known method of forming a conductive pattern comprises, for example, the steps of: applying to a substrate surface a conductive pigment paste prepared by dispersing a conductive pigment such as silver powder in a photosensitive resin, to form a photosensitive conductive layer; irradiating the surface of the conductive layer with an electron beam or ultraviolet light through a photomask; developing the conductive layer; and optionally baking the conductive layer.

The above method, however, has the following problems: the conductive layer is incapable of forming a sharp pattern owing to its insufficient photosensitivity; the photosensitive resin is used in a large quantity and thus generates a great amount of gas when baked, thereby causing environmental problems; and the application of the method is limited because of difficulties in obtaining a thick conductive layer.

DISCLOSURE OF THE INVENTION

An object of the present invention is to provide a novel method of forming a conductive pattern free from the problems of the prior art.

Another object of the present invention is to provide a novel method of forming a conductive pattern, which is capable of forming a sharp pattern, free from environmental problems, and applicable for a wide variety of purposes.

Other objects and features of the present invention will become apparent from the following description.

The present invention provides a method of forming a conductive pattern, comprising the steps of:
(1) depositing a conductive coating-forming resin layer and an energy beam-sensitive coating layer on a substrate in this order;
(2) irradiating a surface of the energy beam-sensitive coating layer with an active energy beam or heat rays directly or through a mask so as to obtain a desired pattern;
(3) developing the energy beam-sensitive coating layer to form a resist pattern coating from the energy beam-sensitive coating layer; and
(4) removing revealed portions of the conductive coating-forming resin layer by development.

The present invention also provides a method of forming a conductive pattern, comprising the steps of:
(1) depositing a conductive coating-forming resin layer and an energy beam-sensitive coating layer on a substrate in this order;
(2) irradiating a surface of the energy beam-sensitive coating layer with an active energy beam or heat rays directly or through a mask so as to obtain a desired pattern; and
(3') developing the energy beam-sensitive coating layer and the conductive coating-forming resin layer simultaneously.

The present inventors carried out extensive research to solve the problems of the prior art, and found that the problems can be solved when an energy beam-sensitive coating layer is deposited over the surface of a conductive coating-forming resin layer on a substrate, and the surface of the energy beam-sensitive coating layer is irradiated with an active energy beam or heat rays directly or through a mask for forming a desired relief pattern, followed by sequential or simultaneous development of the energy beam-sensitive coating layer and the conductive coating-forming resin layer. The present invention has been accomplished based on these findings.

Each step of the method of the present invention will be described below in detail.

Step (1)

In the step (1), a conductive coating-forming resin layer and an energy beam-sensitive coating layer are deposited on a substrate in this order.

The substrate may be, for example, an electrically insulating glass plate, a glass-epoxy plate or any of various plastic substrates. Examples of plastic substrates include films and plates of polyethylene terephthalate, polyimide or the like. The conductive coating-forming resin as such can be used as a plastic substrate. Further, the substrate may have a circuit pattern previously formed thereon.

The conductive coating-forming resin layer is an uncured resin layer which will be finally formed into a conductive pattern. The resin layer may be one substantially non-curable with the energy of heat rays or light beam radiated onto the surface of the energy beam-sensitive coating layer, or may be one curable by post-treatment with heat or light.

The resin for use in the conductive coating-forming resin layer may be conductive or non-conductive. When a conductive resin is used as a resin component for a conductive coating layer, the conductive resin layer may be formed from the conductive resin itself. However, the conductive resin may be used in combination with not only a conductive transparent pigment, a conductive color pigment or like conductive material, but also a non-conductive or semi-conductive, transparent or color pigment. On the other hand, when a non-conductive resin is used, the resin is rendered conductive by adding a conductive transparent pigment, a conductive color pigment or like conductive material. The non-conductive resin can be evaporated by, for example, post-heating, to obtain a conductive coating layer made of the remaining conductive pigment or like conductive material.

It is preferred that the coating formed from the conductive coating-forming resin layer has a volume resistivity not greater than $10^9$ Ω.cm, in particular 1 Ω.cm to $10^8$ Ω.cm.

The conductive coating-forming resin layer preferably has a glass transition temperature higher than the temperature to be employed for development of the resin layer. Stated specifically, in the case where the resin layer is developed using a treating solution, the resin layer has a glass transition temperature that is preferably higher, more preferably at least about 5° C. higher, further more preferably about 10° C. to 200° C. higher, than the temperature of the treating solution. In the case where the resin layer is developed using a powder such as sandblast, the resin layer has a glass transition temperature that is preferably higher, more preferably at least about 5° C. higher, further more preferably about 10° C. to 200° C. higher, than the temperature of the treating atmosphere. If the glass transition temperature is lower than the temperature for development, a high-resolution pattern is difficult to obtain. The glass transition temperature can be determined by DSC (differential scanning calorimetry).

The resin composition constituting the conductive coating-forming resin layer is not limited and may be varied according to the substrate for use in the method of the invention or the product to be obtained by the method. For example, a resin composition is usable which comprises a heat-curable or thermoplastic resin, a photocurable resin or like resin component, and optional component(s) such as a conductive transparent pigment, a conductive color pigment or like conductive material, or a non-conductive transparent pigment, a non-conductive color pigment or like non-conductive material.

Resins usable for forming the conductive coating-forming resin layer include, for example, acrylic resins, polyester resins, alkyd resins, organic silicon resins, epoxy resins, melamine resins, vinyl resins, phenol resins, fluororesins, polyurethane resins, oil-soluble polyimide-modified resins, inorganic silicon resins, and modified resins of at least two of these resins.

When using these resins having the above specified glass transition temperature, the conductive coating-forming resin layer can be removed without reduction of resolution, in the case where the resin layer is subjected to powder treatment such as development by blasting, after pattern formation. In the case where the resin layer is treated with a developer after pattern formation, it is preferable to use, as a conductive coating-forming resin, a resin which has the above specified glass transition temperature and is soluble or dispersible in an acid, an alkali, water or an organic solvent in order to facilitate the treatment with a developer. The conductive coating-forming resin is developable with an alkaline developer when it contains acid group(s); developable with an acid developer when it contains basic group(s); developable with a water developer when it is water-soluble; and developable with an organic solvent developer when it is soluble or dispersible in an organic solvent.

A typical example of acid groups which may be contained in the conductive coating-forming resin is carboxyl. A preferable carboxyl content is such that the resin has an acid value of about 10 to 700 mg KOH/g, in particular about 20 to 600 mg KOH/g. If the resin has an acid value less than about 10 mg KOH/g, the conductive coating-forming resin layer will not be sufficiently removed with an alkaline developer, thus failing to form a high resolution pattern. On the other hand, if the resin has an acid value more than about 700 mg KOH/g, the conductive coating-forming resin layer is excessively removed with an alkaline developer, thus failing to form a high resolution pattern. Therefore, an acid value outside the specified range is undesirable. A typical example of basic groups is amino groups. A preferable amino group content is such that the resin has an amine value of about 20 to 650, in particular about 30 to 600. If the resin has an amine value less than about 20, the conductive coating-forming resin layer will not be sufficiently removed, thus failing to form a high resolution pattern. On the other hand, if the resin has an amine value more than about 650, the conductive coating-forming resin layer is excessively removed, thus failing to form a high resolution pattern. Therefore, an amine value outside the specified range is undesirable.

Examples of acid group-containing resins include acid group-containing acrylic resins, acid group-containing polyester resins, acid group-containing alkyd resins, acid group-containing organic silicon resins, acid group-containing vinyl resins, acid group-containing phenol resins, acid group-containing fluororesins, acid group-containing polyurethane resins, and modified resins of at least two of these resins.

Examples of basic group-containing resins include basic group-containing acrylic resins, basic group-containing polyester resins, basic group-containing alkyd resins, basic group-containing organic silicon resins, basic group-containing vinyl resins, basic group-containing phenol resins, basic group-containing fluororesins, basic group-containing polyurethane resins, alkali silicate resins, and modified resins of at least two of these resins.

Examples of water-soluble resins include polycarboxylic acid resins, cellulose resins, polyvinyl alcohols, melamine resins and onium salt group-containing resins.

Examples of organic solvent-soluble resins include acrylic resins, polyester resins, alkyd resins, organic silicon resins, epoxy resins, vinyl resins, phenol resins, melamine resins, fluororesins, polyurethane resins, oil-soluble polyimide-modified resins, inorganic silicon resins, and modified resins of at least two of these resins. These resins may contain acid or basic group(s).

Usable heat-curable resins for forming a conductive coating include, for example, self-curing resins or combinations of a curable functional group-containing resin and a curing agent. Examples of self-curing resins include melamine resins, and silicon resins containing hydrolyzable group(s) (such as alkoxysilyl or hydroxysilyl). Examples of combinations of a curable functional group-containing resin and a curing agent include: epoxy resin/phenol resin; hydroxyl-containing resin/polyisocyanate; hydroxyl-containing resin/amino resin; epoxy resin/carboxylic acid or carboxylic anhydride; and epoxy resin/polyamine.

The conductive coating-forming resin may be a photocurable conductive coating-forming resin. Examples of such resins include photocurable resins mentioned hereinafter for use in the energy beam-sensitive coating layer.

The conductive coating-forming resin layer may contain a resin for development to impart to the resin layer, a glass transition temperature that is, for example, at least 5° C. higher than the temperature for development of the resin layer. Usable as the resin for development is a resin which is capable of rendering the resin layer developable with the developer (such as dissolution inhibitor). The resin for development may be employed as the main component or an additive resin of the conductive coating-forming resin. The resin for development may remain in the coating formed in the final step.

Examples of conductive pigments and like conductive materials that may be added to the conductive coating-forming resin include known conductive materials such as silver, copper, iron, manganese, nickel, aluminum, cobalt, chromium, lead, zinc, bismuth, ITO (indium-tin oxide) and like metals; alloys comprising at least one of these metals; oxides of these metals; and materials comprising these conductive materials coated or deposited on the surface of insulating materials. Further, non-metallic conductive materials, such as conductive polymers, can be used.

Also usable as a conductive material is a tin dioxide powder doped with antimony, in which a semi-conductive tin dioxide component is doped with an antimony component to form a donor level of electrons and increase the conductivity. The antimony-doped tin dioxide powder can be used singly, or as a coating on another material. The material may be, for example, titanium oxide, potassium titanate, aluminum borate, barium sulfate, mica, silica or the like.

The conductive coating-forming resin layer may contain, where necessary, a heat-fusible inorganic powder (such as a glass frit), a coloring agent (such as a pigment or a dye), a filler or other additives.

The conductive coating-forming resin layer can be formed on the substrate by a process suitable for the purpose without limitation. Typical examples include: a process comprising dissolving or dispersing any of the above conductive coating-forming resins in a suitable solvent such as an organic solvent or water, applying the resulting solution or dispersion of the conductive coating-forming resin to a substrate by coating or printing, and evaporating the solvent; a process comprising heat-molding pellets of the conductive coating-forming resin into a suitable shape; and a process comprising applying a powder of the conductive coating-forming resin to a suitable portion and melting the powder by heating. The conductive coating-forming resin layer may be deposited on a substrate, or the resin layer as such can be used as a substrate. The thickness of the resin layer may be varied according to the intended use, and is preferably about 1 to 100 μm, in particular about 2 to 80 μm when the resin layer is formed on a black matrix or like material by coating or printing. When the resin layer is used as a substrate formed by molding or like means, it has a thickness of preferably about 100 μm to 10 mm, in particular about 200 μm to 5 mm.

Subsequently, an energy beam-sensitive coating layer is deposited on the surface of the conductive coating-forming resin layer formed on a substrate.

Known energy beam-sensitive coating layers can be used in the invention without limitation, as long as they are capable of changing in developer solubility when cured or decomposed by irradiation with an active energy beam or heat rays, and thereby forming a resist pattern coating.

Resin compositions usable for forming the energy beam-sensitive coating layer include, for example, organic solvent-based positive photosensitive resin compositions, organic solvent-based negative photosensitive resin compositions, aqueous positive photosensitive resin compositions, aqueous negative photosensitive resin compositions and like liquid photosensitive resist resin compositions; positive photosensitive dry films, negative photosensitive dry films and like photosensitive dry films; organic solvent-based negative heat-sensitive resin compositions, aqueous negative heat-sensitive resin compositions and like liquid heat-sensitive resin compositions; and negative heat-sensitive dry films and like heat-sensitive dry films.

In particular, a negative or positive resin composition sensitive to visible light is preferred as the composition for forming the energy beam-sensitive coating layer.

Examples of negative photosensitive resin compositions include conventional resin compositions containing a photocurable resin, a photoinitiator and where necessary, a photosensitizer.

The photocurable resin is not limited, and may be a conventionally used photocurable resin which has photosensitive group(s) crosslinkable by light irradiation, and which contains ionic group(s) (anionic or cationic group(s)) so that unexposed portions of the coating layer can be removed by dissolution in an alkaline or acid developer.

The photocurable resin contains unsaturated group(s) such as acryloyl, methacryloyl, vinyl, styryl or allyl.

Of ionic groups, a typical example of anionic groups is carboxyl. A preferred carboxyl content is such that the resin has an acid value of about 10 to 700 mg KOH/g, in particular about 20 to 600 mg KOH/g. If the acid value is less than about 10 mg KOH/g, uncured portions will not be removed sufficiently, resulting in a pattern with unsatisfactory resolution. On the other hand, if the acid value is more than about 700 mg KOH/g, cured portions will be likely to be removed, resulting in a pattern with unsatisfactory resolution. Thus, an acid value outside the specified range is undesirable. A typical example of cationic groups is amino groups. A preferred amino group content is such that the resin has an amine value of about 20 to 650, in particular about 30 to 600. If the amine value is less than about 20, uncured portions will not be removed sufficiently, resulting in a pattern with unsatisfactory resolution. On the other hand, if the amine value is more than about 650, cured portions Will be likely to be removed, resulting in a pattern with unsatisfactory resolution. Thus, an amine value outside the specified range is undesirable.

Examples of anionic resins include resins prepared by reacting a polycarboxylic acid resin with, for example, glycidyl(meth)acrylate or like monomer to introduce unsaturated group(s) and carboxyl group(s) into the resin.

Examples of cationic resins include resins prepared by addition reaction of a hydroxyl- and tertiary amino group-containing resin with a reaction product of a hydroxyl-containing unsaturated compound and a diisocyanate compound.

As the anionic or cationic resin, any of the photocurable resins shown in Japanese Unexamined Patent Publication No. 1991-223759 are usable.

Examples of photoinitiators include benzophenone, benzoin methyl ether, benzoin isopropyl ether, benzyl xanthone, thioxanthone, anthraquinone and like aromatic carbonyl compounds; acetophenone, propiophenone, α-hydroxyisobutylphenone, α,α'-dichloro-4-phenoxyacetophenone, 1-hydroxy-1-cyclohexylacetophenone, diacetylacetophenone, acetophenone and like acetophenones; benzoyl peroxide, t-butylperoxy-2-ethylhexanoate, t-butylhydroperoxide, di-t-butyldiperoxyisophthalate, 3,3',4,4'-tetra(t-butylperoxycarbonyl)benzophenone and like organic peroxides; diphenyl iodobromide, diphenyliodonium chloride and like diphenyl halonium salts; carbon tetrabromide, chloroform, iodoform and like organic halides; 3-phenyl-5-isooxazolone, 2,4,6-tris(trichloromethyl)-1,3,5-triazine benzanthrone and like heterocyclic or polycyclic compounds; 2,2'-azo(2,4-dimethylvaleronitrile), 2,2'-azobisisobutyronitrile, 1,1'-azobis(cyclohexane-1-carbonitrile), 2,2'-azobis(2-methylbutylonitrile) and like azo compounds; iron-allene complexes; titanocene compounds; bisimidazole compounds; N-aryl glycidyl compounds; acridine compounds; combinations of aromatic ketone/aromatic amine; and peroxyketals. These photoinitiators can be used either singly or in combination.

Examples of the iron-allene complexes include those described in European Patent No. 152377. Examples of titanocene compounds include those described in Japanese Unexamined Patent Publication No. 1988-221110. Examples of peroxyketals include those described in Japanese Unexamined Patent Publication No. 1994-321895.

Of the above photoinitiators, di-t-butyldiperoxy isophthalate, 3,3',4,4'-tetra(t-butylperoxycarbonyl) benzophenone, iron-allene complexes and titanocene compounds are preferable because of their high crosslinking or polymerizing effects.

Commercially available photoinitiators include, for example, Irgacure 651 (tradename of Ciba-Geigy for acetophenone photoradical polymerization initiator), Irgacure 184 (tradename of Ciba-Geigy for acetophenone photoradical polymerization initiator), Irgacure 1850 (tradename of Ciba-Geigy for acetophenone photoradical polymerization initiator), Irgacure 907 (tradename of Ciba-Geigy for aminoalkylphenone photoradical polymerization initiator), Irgacure 369 (tradename of Ciba-Geigy for an aminoalkylphenone photoradical polymerization initiator), Lucirin TPO (tradename of BASF for 2,4,6-trimethylbenzoyldiphenylphosphine oxide), Kayacure DETXS (tradename of Nippon Kayaku K.K.) and CGI-784 (tradename of Ciba-Geigy for titanium complex compound). These photoinitiators can be used either singly or in combination.

The photoinitiator is used in an amount of 0.1 to 25 parts by weight, preferably 0.2 to 10 parts by weight, per 100 parts by weight of the photocurable resin.

Known photosensitizing dyes are usable as photosensitizers. Examples of photosensitizing dyes include thioxanthene dyes, xanthene dyes, ketone dyes, thiopyrylium salt dyes, base styryl dyes, merocyanine dyes, 3-substituted coumarin dyes, 3,4-substituted coumarin dyes, cyanine dyes, acridine dyes, thiazine dyes, phenothiazine dyes, anthracene dyes, coronene dyes, benzanthracene dyes, perylene dyes, merocyanine dyes, ketocoumarin dyes, fumarine dyes and borate dyes. These dyes can be used either singly or in combination. Examples of borate photosensitizing dyes include those described in Japanese Unexamined Patent Publications No. 1993-241338, No. 1995-5685 and No. 1995-225474.

Also usable are unsaturated resins, which suppress the solubility of photopolymerizable compositions. For example, an unsaturated resin can be used as an agent for suppressing the solubility and like properties of a resist coating in an alkaline developer. Examples of unsaturated resins include polyester resins, alkyd resins, (meth)acrylic resins, vinyl resins, epoxy resins, phenol resins, natural resins, synthetic rubbers, silicon resins, fluororesins and polyurethane resins. These resins can be used either singly or in combination.

When a negative photosensitive resin composition is used as an organic solvent-based resin composition, the photosensitive resin composition is dissolved or dispersed in an organic solvent such as a ketone, an ester, an ether, a cellosolve, an aromatic hydrocarbon, an alcohol or a halogenated hydrocarbon.

Usable as an aqueous negative photosensitive resin composition is a known water-developable photosensitive resin composition such as an aqueous novolak phenol epoxy resin having photopolymerizable unsaturated group(s) and ion-forming group(s). Such a resin can be obtained by adding a (meth)acrylic acid to part of the epoxy groups of a novolak phenol epoxy resin to thereby introduce photopolymerizable unsaturated group(s) into the resin, followed by reaction of the epoxy groups with, for example, a tertiary amine compound to thereby form aqueous onium salt groups. The obtained resin, when exposed, is photocured and becomes insoluble in water, while unexposed portions of the resin are removable with water owing to the presence of the ion-forming group(s). Further, when the resin is post-heated (for example at about 140 to 200° C. for 10 to 30 minutes), the ion-forming group(s) is evaporated, making the coating of the resin hydrophobic. Thus, unlike the alkali- or acid-developable photosensitive composition, the aqueous novolak phenol epoxy resin composition is capable of forming a highly resistant coating free from hydrophilic groups (such as carboxyl or amino groups) or their salts (salts formed by the developer).

Other aqueous negative photosensitive resin compositions include, for example, radical polymers obtained in a similar manner to the above, by addition reaction of a (meth)acrylic acid with a homopolymer of one of epoxy-containing radically polymerizable unsaturated monomers such as glycidyl (meth)acrylate, 3,4-epoxycyclohexylalkyl (meth)acrylate and vinyl glycidyl ether, or with a copolymer of at least one of these monomers and another radically polymerizable unsaturated monomer (such as a $C_{1-24}$ alkyl or cycloalkyl (meth)acrylate, or a radically polymerizable unsaturated aromatic compound), to thereby impart photopolymerizability to the polymer, followed by reaction of the epoxy groups with, for example, a tertiary amine compound to form water-soluble onium salt groups.

The aqueous negative photosensitive resin composition, i.e., an aqueous resist composition, can be obtained by dissolving or dispersing any of the above negative photosensitive resin compositions in water.

The photosensitive resin composition can be rendered water-soluble or water-dispersible by neutralizing anionic group(s) (such as carboxyl) in the photopolymerizable composition with an alkaline neutralizing agent, or by neutralizing cationic group(s) (such as amino group(s)) in the photopolymerizable composition with an acid neutralizing agent. When the resin composition is aqueous, it can be dispersed or dissolved in water without any treatment.

The negative photosensitive resin composition is applied to the surface of the conductive coating-forming resin layer on the substrate, for example using a roller, a roll coater, a spin coater or a curtain roll coater, or by spray coating, electrostatic coating, dip coating, silk printing, spin coating or like means.

The resulting coating is set where necessary, and dried to obtain a resist coating.

A cover coat layer may be formed on the surface of the obtained resist coating before curing by exposure. The cover coat layer blocks oxygen in air and protects radicals generated by exposure from being inactivated by oxygen, so that the photosensitive material is cured smoothly by exposure.

The negative photosensitive dry film is obtained by applying a negative photosensitive resin composition to, for example, a release sheet made of polyethylene terephthalate, followed by evaporation of water or organic solvent for drying. The resulting dry film is attached to the surface of the conductive coating-forming resin layer on the substrate, and the release sheet is removed before or after irradiation with an active energy beam.

Next, the positive photosensitive resin composition will be described.

The positive photosensitive resin composition may be, for example, a resin composition containing a photo-acid generating agent, a resin and, where necessary, a photosensitizer. In the composition, the photo-acid generating agent is decomposed by light and generates an acid, which then decomposes the resin and thereby alters the polarity, molecular weight and other properties of the resin. As a result, the resin is rendered soluble in an alkaline or acid aqueous developer. The composition may contain, where necessary, another resin to adjust the solubility in the developer.

Typical examples of the positive photosensitive resin composition include a composition mainly comprising a base resin with ion-forming group(s) (e.g., an acrylic resin) which contains a quinonediazidesulfonic acid bonded via a sulfonic acid ester bond, i.e., a naphthoquinonediazide photosensitive composition in which quinonediazide group(s) is capable of being photodecomposed by light irradiation and converted to indenecarboxylic acid via ketene; and a positive photosensitive composition which shows such mechanism that the composition, when heated, forms a crosslinked coating insoluble in an alkaline or acid developer, and the crosslinked coating, when irradiated with light, becomes soluble in an alkaline or acid developer as a result of cleavage of the crosslinking structure by a function of the photo-acid generating agent which generates acid group(s) when irradiated.

The composition mainly comprising a base resin with ion-forming group(s) which contains a quinonediazidesulfonic acid bonded via a sulfonic acid ester bond may be one described in Unexamined Japanese Patent Publications No. 1986-206293 and No. 1995-133449 and other publications. The positive photosensitive composition which shows such mechanism that it forms, when heated, an insoluble crosslinked coating which, when irradiated, is rendered soluble in a developer by cleavage of the crosslinking structure, is shown in Japanese Unexamined Patent Publication No. 1994-295064, No. 1994-308733, No. 1994-313134, No. 1994-313135, No. 1994-313136 and No. 1995-146552 and other publications.

The photo-acid generating agent is a compound which generates an acid, when exposed to light. The generated acid serves as a catalyst for decomposing the resin. Known photo-acid generating agents are usable, which include, for example, sulfonium salts, ammonium salts, phosphonium salts, iodonium salts, selenium salts and like onium salts; iron-allene complexes, ruthenium-allene complexes, silanol-metal chelate complexes, triazine compounds, diazidenaphthoquinone compounds, sulfonic acid esters, sulfonic acid imide esters and halogen compounds. Also usable are photo-acid generating agents shown in Japanese Unexamined Patent Publications No. 1995-146552 and No. 1997-289218. The photo-acid generating agent can be used as mixed with or bonded to any of the above resins. The amount of the photo-acid generating agent to be used is preferably about 0.1 to 40 parts by weight, in particular about 0.2 to 20 parts by weight, per 100 parts by weight of the resin.

When the positive photosensitive resin composition is used as an organic solvent-based resin composition, the positive photosensitive resin composition is dissolved or dispersed in an organic solvent (such as a ketone, an ester, an ether, a cellosolve, an aromatic hydrocarbon, an alcohol or a halogenated hydrocarbon).

An aqueous positive photosensitive resin composition can be obtained by dissolving or dispersing the positive photosensitive resin composition in water. The positive photosensitive resin is rendered water-soluble or water-dispersible by neutralizing carboxyl group(s) or amino group(s) of the positive photosensitive resin composition with an alkaline or acid neutralizing agent.

The positive photosensitive resin composition is applied to the surface of the conductive coating-forming resin layer on the substrate, for example using a roller, a roll coater, a spin coater or a curtain roll coater, or by spray coating, electrostatic coating, dip coating, silk printing, spin coating or like means.

The organic solvent-based or aqueous positive photosensitive resin composition applied on the substrate is set where necessary, and dried at about 50 to 130° C. to obtain a positive photosensitive coating.

The positive photosensitive dry film can be obtained by applying the positive photosensitive resin composition to, for example, a release sheet made of polyethylene terephthalate, followed by evaporation of water or organic solvent for drying, or heating for curing. The release sheet is removed after attaching the resulting dry film to the surface of the conductive coating-forming resin layer on the substrate.

The organic solvent-based negative heat-sensitive resin composition for forming the energy beam-sensitive coating layer is a solution or dispersion in an organic solvent, of a resin composition crosslinkable with heat rays such as infrared rays. The resin composition may be a known resin composition, such as hydroxyl-containing resin/amino resin; hydroxyl-containing resin/blocked isocyanate; hydroxyl-containing resin/melamine resin; hydroxyl-containing resin/silicon resin containing hydrolyzable group(s) such as alkoxysilyl or hydroxysilyl; hydroxyl-containing resin/hydrolyzable group-containing acrylic resin; epoxy resin/phenol resin; epoxy resin/carboxylic acid or carboxylic anhydride; epoxy resin/polyamine; unsaturated resin/radical polymerization catalyst (such as peroxide); or an olefinic unsaturated compound containing ether bond(s) and carboxyl and/or hydroxyphenyl.

The aqueous negative heat-sensitive resin composition may be one prepared as follows: acid or basic group(s) is incorporated into a resin comprised in any of the above resin compositions crosslinkable by heat rays such as infrared rays, and the resin is then neutralized with a basic compound or acid compound and dissolved or dispersed in water.

The negative heat-sensitive dry film can be obtained by applying a negative heat-sensitive resin composition to, for example, a release sheet made of polyethylene terephthalate, followed by evaporation of water or organic solvent for drying. The dry film is attached to the surface of the conductive coating-forming resin layer on the substrate, and the release sheet is removed before or after irradiation with an active energy beam.

The combination of the energy beam-sensitive coating layer/conductive coating-forming resin layer for use in the step (1) may be, for example, photocurable energy beam-sensitive coating layer/photocurable conductive coating-forming resin layer; photocurable energy beam-sensitive coating layer/heat-curable conductive coating-forming resin layer; heat-curable energy beam-sensitive coating layer/photocurable conductive coating-forming resin layer; heat-curable energy beam-sensitive coating layer/heat-curable conductive coating-forming resin layer; photocurable energy beam-sensitive coating layer/non-curable conductive coating-forming resin layer; or heat-curable energy beam-sensitive coating layer/non-curable conductive coating-forming resin layer. As described above, the curabllility of the conductive coating-forming resin is such that the resin layer is not substantially cured by the energy beam irradiation of the energy beam-sensitive coating layer, but is cured (post-cured) by post-treatment with heat, light or the like carried out after development of the energy-beam sensitive coating layer.

The energy beam-sensitive coating layer may be of negative type or positive type. Also, the conductive coating-forming resin layer may be of negative type or positive type.

In the case where the energy beam radiated onto the surface of the energy beam-sensitive coating layer is heat rays, a conductive coating-forming resin layer is usable which has no heat-sensitivity or less heat-sensitivity than the energy beam-sensitive layer, and which is substantially non-curable by irradiation with the heat rays.

For curing the energy beam-sensitive coating layer alone by irradiation with heat rays without curing the conductive coating-forming resin layer, conditions such as type of heat rays, irradiation time and amount of irradiation energy are suitably selected so that the energy beam-sensitive coating layer receives sufficient heat to facilitate development while the conductive coating-forming resin layer is prevented from adverse effects of the development. The resin compositions in the energy beam-sensitive coating layer and the conductive coating-forming resin layer may be the same, but preferably they are different from each other to achieve improved results. The combination of heat-curable layers of different types is, for example, heat-sensitive energy beam-sensitive coating layer/heat-curable conductive coating-forming resin layer, such as blocked polyisocyanate curable resin layer/an amino curable resin layer.

In the case where the energy beam radiated onto the surface of the energy beam-sensitive coating layer is a light beam, a conductive coating-forming resin layer is usable which has no photosensitivity or less photosensitivity than the energy beam-sensitive layer, and which is substantially non-curable by irradiation with the light beam. For curing the energy beam-sensitive coating layer alone by irradiation with a light beam without curing the conductive coating-forming resin layer, conditions such as type of light beam, irradiation time and amount of irradiation energy are suitably selected so that the energy beam-sensitive coating layer receives sufficient light to facilitate development while the conductive coating-forming resin layer is protected from adverse effects of the development. The resin compositions of the energy beam-sensitive coating layer and the conductive coating-forming resin layer may be the same, but preferably they are different from each other to achieve improved results. The combination of photocurable layers of different types is, for example, photosensitive energy beam-sensitive coating layer/photosensitive conductive coating-forming resin layer; or visible light-sensitive resin layer/ultraviolet light-sensitive conductive coating-forming resin layer.

Further, the conductive coating-forming resin layer may be a heat-curable conductive resin layer when the energy beam radiated onto the surface of the energy beam-sensitive coating layer is a light beam, and may be a photocurable conductive resin layer when the energy beam is heat rays.

In the above manner, the step (1) forms a conductive coating-forming resin layer and an energy beam-sensitive coating layer deposited on a substrate in this order.

Step (2)

In the step (2), the surface of the energy beam-sensitive coating layer deposited on the conductive coating-forming resin layer on the substrate is irradiated with an active energy beam or heat rays, directly or through a mask, so as to obtain a desired pattern.

The negative photosensitive resin coating obtained by applying an organic solvent-based or aqueous negative photosensitive resin composition to the surface of the conductive coating-forming resin layer on the substrate is irradiated with a light beam for photocuring, so as to obtain a desired resist coating (image).

The positive photosensitive resin coating obtained by applying an organic solvent-based or aqueous positive photosensitive resin composition to the surface of the conductive coating-forming resin layer on the substrate is irradiated with a light beam to decompose the resin, so as to obtain a desired resist coating (image).

Light sources usable for photocuring or photodecomposition are not limited and include, for example, an extra-high pressure, high-pressure, medium-pressure or low-pressure mercury lamps, chemical lamps, carbon arc lamps, xenon lamps, metal halide lamps and tungsten lamps. Also usable are various lasers that produce an oscillating beam in the visible region, such as argon lasers (488 nm), YAG-SHG lasers (532 nm) and UV lasers (351 to 364 nm).

The negative heat-sensitive resin coating obtained by applying an organic solvent-based or aqueous negative heat-sensitive resin composition to the surface of the conductive coating-forming resin layer on the substrate is irradiated with heat rays for curing, so as to obtain a desired resist coating (image).

Usable heat rays include, for example, semiconductor laser beams (830 nm) and YAG laser beams (1.06 $\mu$m).

In this manner, the step (2) performs energy beam irradiation of the surface of the energy beam-sensitive coating layer deposited on the conductive coating-forming resin layer on the substrate, so as to obtain a desired pattern.

Steps (3), (4) and (3')

After irradiation of the energy beam-sensitive coating layer with an energy beam in the step (2), the steps (3) and (4) or the step (3') are carried out to form a conductive pattern by developing the energy beam-sensitive coating layer and the conductive coating-forming resin layer sequentially or simultaneously.

When the energy beam-sensitive coating layer is formed from a negative photosensitive resin composition or a negative heat-sensitive resin composition, unexposed portions (portions not irradiated with a light beam or heat rays in the step (2) to obtain a desired resist coating (image)) of the coating layer are removed by development using a developer.

When the energy beam-sensitive coating layer is formed from a positive photosensitive resin composition, exposed portions (portions irradiated with a light beam in the step (2) to obtain a desired resist coating (image)) of the coating layer are removed by development using a developer.

When the positive photosensitive resin composition is an anionic composition, alkali development is performed, and when the positive photosensitive resin composition is a cationic composition, acid development is carried out. Alternatively, water development can be carried out when the positive photosensitive resin composition comprises a water-soluble resin mentioned above (such as onium salt group-containing resin). The developer for such treatment may be any of those employed for removal of the conductive coating-forming resin layer, which will be mentioned hereinafter.

The revealed portions of the conductive coating-forming resin layer is removed by chemical means such as liquid developer treatment, or by physical means such as sand-blasting.

In the liquid developer treatment, the energy beam-sensitive coating layer and the conductive coating-forming resin layer can be developed sequentially in this order or simultaneously. Conditions for development are not limited, but are preferably as follows: For sequential development, the energy beam-sensitive coating layer is developed at a developer temperature of about 10 to 50° C., preferably about 15 to 40° C., for a developing time of about 10 seconds to 20 minutes, preferably about 15 seconds to 15 minutes, and the conductive coating-forming resin layer is developed by immersion in a developer at a temperature of about 10 to 80° C., preferably 15 to 50° C., for a developing time of about 15 seconds to 60 minutes, preferably 1 minute to 20 minutes. For simultaneous development, the overlapping range of the above conditions is preferably employed.

The liquid development of the energy beam-sensitive coating layer and conductive coating-forming resin layer is carried out using an alkaline developer in the case where acid group(s) is contained in the resin for forming the energy beam-sensitive coating layer or the conductive coating-forming resin layer. When basic group(s) is contained in the resin, an acid developer can be used. When hydrophilic group(s) is contained in the resin, water can be used as a developer. When the resin is soluble or dispersible in an organic solvent, an organic solvent can be used as a developer.

Examples of alkaline developers include aqueous solutions of monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide and the like.

Examples of acid developers include aqueous solutions of formic acid, crotonic acid, acetic acid, propionic acid, lactic acid, hydrochloric acid, sulfuric acid, nitric acid, phosphoric acid and the like.

It is preferable that the concentration of the acid or alkaline substance in the developer is usually about 0.05 to 10 wt. %.

Usable organic solvents include, for example, hexane, heptane, octane, toluene, xylene, dichloromethane, chloroform, carbon tetrachloride, trichloroethylene and like hydrocarbon solvents; methanol, ethanol, propanol, butanol and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; and pyridine, formamide, N,N-dimethylformamide and other solvents.

The method of sandblasting can be suitably selected according to the material and thickness of the resin layer. For example, calcium carbonate particles, glass beads or like particles having a diameter of 10 to 30 $\mu$m are blasted at a pressure of about 1 to 3 kg/cm$^2$, to form a conductive pattern. The temperature of the atmosphere for development by this method is not limited, and may be usually about 10 to 100° C., preferably about 20 to 80° C.

In the above manner, the steps (3) and (4) or (3') form a desired conductive pattern.

Conductive patterns formed by the method of the present invention include, for example, conductive patterns for black matrixes, conductive patterns for color filters, conductive patterns for various display panels, and conductive patterns for plastic substrates or buildup plastic substrates.

In the method of the invention, where necessary, the energy beam-sensitive coating layer remaining on the pattern formed by development of the conductive coating-forming resin layer can be decomposed by irradiation with an active energy beam and removed by dissolution in a developer.

Also, the pattern of the conductive coating-forming resin layer formed in the step (4) or (3') can be, where necessary, crosslinked and post-cured by heating or irradiation with an active energy beam.

After the step (3') or (4), the energy beam-sensitive coating layer can be removed from the pattern by a known method. For example, an energy beam-sensitive coating layer containing acid group(s) can be removed using an aqueous alkali solution; an energy beam-sensitive coating layer containing basic group(s) can be removed using an aqueous acid solution; and an energy beam-sensitive coating layer soluble in an organic solvent can be removed using an organic solvent.

Also, after development of the conductive coating-forming resin layer (formation of a pattern), the pattern may be crosslinked or baked, by heating, allowing to stand at room temperature or exposure to light.

The method of the invention is applicable for any purposes without limitation, as long as the method comprises the above steps.

The conductive pattern formed by the method of the invention can be used, where necessary, in combination with an insulating coating or an insulating pattern coating.

Typical embodiments of the present invention are briefly described below. It should be noted, however, the present invention is not limited to these embodiments.

(I) Method of Forming Transparent Electrodes for Display Panels

A transparent conductive coating layer (a conductive coating-forming resin layer according to the invention) is formed on the whole of one surface of a glass substrate, and an energy beam-sensitive coating layer is deposited on the surface of the resulting transparent conductive coating layer. Subsequently, the surface of the energy beam-sensitive coating layer is irradiated with an active energy beam directly or through a pattern mask so as to obtain a desired pattern on the transparent conductive coating layer. The energy beam-sensitive coating layer is developed, and the revealed portions of the conductive coating-forming resin layer are developed, and then the energy beam-sensitive coating layer is removed from the pattern, thereby giving a transparent electrode pattern. Alternatively, the energy beam-sensitive coating layer and the conductive coating-forming resin layer may be simultaneously developed. The resin for forming the transparent conductive coating layer preferably has a glass transition temperature higher than the temperature employed for development of the conductive coating layer.

After developing, the transparent conductive coating layer is baked, for example, at about 300° C. to 800° C. for about 20 to 60 minutes to thereby form a conductive pattern coating.

By the baking step, the conductive coating-forming resin component is evaporated, and the remaining transparent conductive pigment component undergoes fusing, melting or the like so as to form a transparent conductive coating.

The energy beam-sensitive coating layer can be removed by the baking step.

Examples of transparent conductive pigments include ITO and tin dioxide.

(II) Method of Forming Colored Electrodes for Display Panels

A colored conductive coating layer (a conductive coating-forming resin layer according to the invention) is formed on the whole of one surface of a glass substrate, and an energy beam-sensitive coating layer is deposited on the surface of the resulting colored conductive coating layer. Subsequently, the surface of the energy beam-sensitive coating layer is irradiated with an active energy beam directly or through a pattern mask so as to obtain a desired pattern on the colored conductive coating. The energy beam-sensitive coating layer is developed, and revealed portions of the colored conductive coating-forming resin layer are developed, and then the energy beam-sensitive coating layer is removed from the pattern, thereby giving a colored electrode pattern. Alternatively, the energy beam-sensitive coating layer and the conductive coating-forming resin layer can be simultaneously developed. The resin for forming the colored conductive coating layer preferably has a glass transition temperature higher than the temperature employed for development of the conductive coating layer.

After development, the colored conductive coating layer is baked, for example, at about 300° C. to 800° C. for about 20 to 60 minutes to thereby form a conductive pattern coating.

By the baking step, the conductive coating-forming resin component is evaporated, and the remaining color conductive pigment component undergoes fusing, melting or the like so as to form a colored conductive pattern coating.

The energy beam-sensitive coating layer can be removed by the baking step.

Examples of color conductive pigments usually used include silver, copper and nickel. These pigments can be used, where necessary, in combination with a color pigment such as carbon black.

These methods of the invention can be combined to form, for example, patterns for bus electrodes or address electrodes for plasma displays, which comprises a transparent electrode pattern layer and a black or silver conductive coating layer deposited on the whole or part of the transparent electrode pattern layer.

BEST MODE FOR CARRYING OUT THE INVENTION

The following Preparation Examples, Examples and Comparative Examples are provided to illustrate the invention in further detail. In these examples, parts and percentages are all by weight.

Preparation Example 1

Preparation of Aqueous Negative Photosensitive Anionic Composition 1

A photocurable resin solution (nonvolatile content: 55%; organic solvent: propylene glycol monomethyl ether; resin acid value: 50 mg KOH/g; number average molecular weight: about 20,000) was prepared by reacting 24 parts of glycidyl methacrylate with 100 parts of an acrylic acid (resin acid value: 155 mg KOH/g; monomer weight ratio: methyl methacrylate/butyl methacrylate/acrylic acid=40/40/20; molecular weight: 1000). To 100 parts (as solids) of the photocurable resin were added 1 part of a photopolymerization initiator (tradename "CGI-784", a titanocene compound manufactured by Ciba-Geigy) and 1 part of a photosensitizer (tradename "LS-148", a coumarin dye manufactured by Mitsui Toatsu Chemicals, Inc.), giving a photosensitive liquid.

7 parts of triethyl amine was added to 100 parts (as solids) of the photosensitive liquid, followed by stirring. The mixture was dispersed in deionized water to thereby obtain an aqueous resin dispersion (anionic composition 1) having a solid content of 15%.

Preparation Example 2

Preparation of Aqueous Negative Photosensitive Cationic Composition 2

A photocurable resin (amine value: about 56; unsaturation degree: 1.83 moles/kg) was prepared by addition reaction of 100 parts of an acrylic copolymer (monomer weight ratio: methyl acrylate/styrene/butyl acrylate/glycidyl methacrylate/dimethylaminoethyl methacrylate=20/10/22/30/18) with 15 parts of acrylic acid. To 100 parts of the photocurable resin were added 0.5 parts of the same photosensitizer as used in Preparation Example 1, 55 parts of trimethylolpropane triacrylate and 20 parts of the same titanocene compound as used in Preparation Example 1, giving a photosensitive liquid. 3 parts of acetic acid was added to 100 parts (as solids) of the photosensitive liquid, and the resulting mixture was dispersed in ionized water to thereby obtain an aqueous resin dispersion (cationic composition 2) having a solid content of 15%.

Preparation Example 3

Preparation of Aqueous Positive Photosensitive Anionic Composition 3

A mixture of 200 parts of tetrahydrofuran, 65 parts of p-hydroxystyrene, 28 parts of n-butyl acrylate, 11 parts of acrylic acid and 3 parts of azobisisobutyronitrile was reacted at 100° C. for 2 hours. The reaction product was poured into 1500 cc of toluene as a solvent, and allowed to precipitate. The precipitate was isolated and dried at 60° C., giving a photosensitive resin having a molecular weight of about 5,200 and a hydroxyphenyl content of 4.6 moles/kg. To 100 parts of the photosensitive resin were added 60 parts of a divinyl ether compound (a condensate of 1 mole of a bisphenol compound and 2 moles of 2-chloroethyl vinyl ether), 10 parts of "NAI-105" (tradename of a photo-acid generating agent manufactured by Midori Kagaku K.K.) and 1.5 parts of "NKX-1595" as a photosensitizing dye (tradename of Nippon Kanko Shikiso K.K. for a coumarin dye). To 100 parts (as solids) of the mixture was added 7 parts of triethylamine with stirring, and the resulting mixture was dispersed in deionized water to thereby obtain an aqueous resin dispersion (an anionic composition 3) having a solid content of 15%.

Preparation Example 4

Preparation of Aqueous Positive Photosensitive Cationic Composition 4

A mixture of 200 parts of tetrahydrofuran, 65 parts of p-hydroxystyrene, 18 parts of dimethylaminoethyl methacrylate, 17 parts of n-butylacrylate and 3 parts of azobisisobutyronitrile was reacted at 100° C. for 2 hours. The reaction product was poured into 1500 cc of toluene as a solvent, and allowed to precipitate. The precipitate was isolated and dried at 60° C. to thereby obtain a photosensitive resin having a molecular weight of about 5,000 and a hydroxyphenyl group content of 4.6 moles/kg. To 100 parts of the photosensitive resin were added 60 parts of a divinyl ether compound (a condensate of 1 mole of a bisphenol compound and 2 moles of 2-chloroethyl vinyl ether), 10 parts of "NAI-105" (tradename of Midori Kagaku K.K. for a photo-acid generating agent) and 1.5 parts of the same photosensitizing agent as used in Preparation Example 3. To 100 parts (as solids) of the mixture was added 7 parts of hydroxyacetic acid with stirring, and the resulting mixture was dispersed in deionized water to thereby obtain an aqueous resin dispersion (a cationic composition 4) having a solid content of 15%.

Preparation Example 5

Preparation of Organic Solvent-based Negative Photosensitive Composition 5

The same photosensitive liquid as used in Preparation Example 1 (the composition before addition of triethylamine and water) was dissolved in a diethylene glycol dimethyl ether solvent, to thereby obtain a resin solution in the organic solvent (photosensitive composition 5) having a solid content of 30%.

Preparation Example 6

Preparation of Organic Solvent-based Negative Photosensitive Composition 6

The same photosensitive liquid as used in Preparation Example 2 (the composition before addition of acetic acid and water) was dissolved in a diethylene glycol dimethyl ether solvent, to thereby obtain a resin solution in the organic solvent (photosensitive composition 6) having a solid content of 30%.

Preparation Example 7
Preparation of Organic Solvent-based Positive Photosensitive Composition 7

The same photosensitive liquid as used in Preparation Example 3 (the composition before addition of triethylamine and water) was dissolved in diethylene glycol dimethyl ether as a solvent, to thereby obtain a resin solution in the organic solvent (composition 7) having a solid content of 30%.

Preparation Example 8
Preparation of Organic Solvent-based Positive Photosensitive Composition 8

The same photosensitive liquid as used in Preparation Example 4 (the composition before addition of hydroxyacetic acid and water) was dissolved in diethylene glycol dimethyl ether as a solvent, to thereby obtain a resin solution in the organic solvent (photosensitive composition 8) having a solid content of 30%.

Preparation Example 9
Preparation of Negative Dry Film 1

The organic solvent-based negative photosensitive composition 5 was applied by roller coating to a polyethylene terephthalate film to a dry thickness of 20 $\mu$m. The organic solvent was evaporated to obtain a dry film 1.

Preparation Example 10
Preparation of Negative Dry Film 2

The organic solvent-based negative photosensitive composition 6 was applied by roller coating to a polyethylene terephthalate film to a dry thickness of 20 $\mu$m. The organic solvent was evaporated to obtain a dry film 2.

Preparation Example 11
Preparation of Positive Dry Film 3

The organic solvent-based positive photosensitive composition 7 was applied by roller coating to a polyethylene terephthalate film to a dry thickness of 20 $\mu$m. After setting, the coating was heated at 90° C. for 30 minutes to obtain a dry film 3.

Preparation Example 12
Preparation of Positive Dry Film 4

The organic solvent-based positive photosensitive composition 8 was applied by roller coating to a polyethylene terephthalate film to a dry thickness of 20 $\mu$m. After setting, the coating was heated at 90° C. for 30 minutes to obtain a dry film 4.

Preparation Example 13

Preparation of Organic Solvent-based Negative Heat-sensitive Composition 1

In toluene as a organic solvent were dissolved 100 parts of an acrylic resin (monomer weight ratio: methyl methacrylate/styrene/n-butyl methacrylate/3,4-epoxycyclohexyl methacrylate/oxatane methacrylate=45/10/10/25/10; weight average molecular weight: 10,000) and 1 part of "Cyracure UVI-6990" (tradename for a cationic polymerization catalyst manufactured by Union Carbide Corp.) to obtain a heat-sensitive composition 1 having a solid content of 50%.

Preparation Example 14
Preparation of Conductive Material A for Use in Examples

A mixture of 61 parts of methyl methacrylate, 20 parts of n-butyl acrylate, 4 parts of hydroxyethyl acrylate, 15 parts of acrylic acid and 10 parts of t-butylperoxy benzoate were added dropwise over 2 hours with stirring to 100 parts of 2-butoxyethanol heated to 110° C. in a flask. The mixture was maintained at the same temperature for 2 hours, giving an acrylic resin solution having a solid content of about 50% (glass transition temperature: 48° C.; weight average molecular weight of the resin: 16,000). To 200 parts of the acrylic resin solution having a solid content of about 50% were added 10 parts of isobutyl acetate, 148 parts of 3-methoxybutyl acetate, 12 parts of "BYK160" (a high molecular weight copolymer for use as a pigment dispersant manufactured by BYK-Chemie), 660 parts of a silver powder and 33 parts of a glass frit (a powder with an average particle size of 1.6 $\mu$m consisting of 60% of PbO, 20% of $B_2O_3$, 15% of $SiO_2$ and 5% of $Al_2O_3$). The pigment was dispersed using a pebble mill, giving a silver paste. 780 parts of 3-methoxybutyl acetate was added to 320 parts of the silver paste to obtain a conductive material A.

Preparation Example 15
Preparation of Conductive Material B for Use in Examples

A conductive material B was prepared in the same manner as in the preparation of the conductive material A, except using, as the acrylic resin, an acrylic resin solution having a solid content of 50% (glass transition temperature: 25° C.; weight average molecular weight of the resin: 16,000) obtained in the following manner: A mixture of 53 parts of methyl methacrylate, 11 parts of acrylic acid, 37 parts of n-butyl acrylate and 10 parts of t-butylperoxy benzoate was added dropwise over 2 hours with stirring to 100 parts of 2-butoxyethanol heated to 110° C. in a flask, and the resulting mixture was maintained at the same temperature for 2 hours.

Preparation Example 16
Preparation of Conductive Material C for Use in Examples

A conductive material C was prepared in the same manner as in the preparation of the conductive material A except for using, in place of the silver powder and glass frit, 100 parts of a conductive graphite pigment (average particle size: about 1 $\mu$m).

Preparation Example 17
Preparation of Conductive Material D for Use in Examples

A conductive material D was prepared in the same manner as in the preparation of the conductive material A except that 20 parts of triglycidyl isocyanurate was added to 100 parts (as solids) of the acrylic resin.

Preparation Example 18
Preparation of Conductive Material E for Use in Comparative Examples A conductive material E was prepared in the same manner as in the preparation of the conductive material A except using, as the acrylic resin, an acrylic resin solution having a solid content of about 50% (glass transition temperature: 0° C., weight average molecular weight of the resin: 16,000) obtained in the following manner: A mixture of 42 parts of methyl methacrylate, 5 parts of acrylic acid, 53 parts of n-butyl acrylate and 10 parts of t-butylperoxy benzoate was added dropwise over 2 hours with stirring to 100 parts of 2-butoxyethanol heated to 110° C. in a flask, and the resulting mixture was maintained at the same temperature for 2 hours.

EXAMPLE 1

The conductive material A was applied using a spin coater to the whole of one surface of a transparent glass plate substrate (200 mm×200 mm×1.1 mm) having stripe electrodes (line(pattern width)/space=100 $\mu$m/20 $\mu$m), and preliminarily dried at 80° C. for 10 minutes, to form a conductive coating A with a thickness of about 5 $\mu$m.

Subsequently, the aqueous negative photosensitive anionic composition 1 was applied by roller coating to the conductive coating A to a dry thickness of 6 $\mu$m, and dried at 80° C. for 10 minutes to form a negative photosensitive anionic coating.

The surface of the negative photosensitive anionic coating was directly irradiated with 5 mJ/cm$^2$ of argon laser beam (oscillating at 488 nm) to obtain a pattern (line/space=50 $\mu$m/100 $\mu$m), so that the conductive coating would be formed into a desired electrode pattern when developed. Subsequently, unexposed portions of the anionic coating and underlying portions of conductive coating were simultaneously developed by immersion in an alkaline developer (a) (0.25 wt. % aqueous solution of sodium carbonate) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than 10$^3$ $\Omega$.cm.

EXAMPLE 2

A conductive coating A was formed on a transparent glass plate in the same manner as in Example 1.

The aqueous negative photosensitive cationic composition 2 was applied by roller coating to the conductive coating A to a dry thickness of 6 $\mu$m, and dried at 80° C. for 10 minutes to form a negative photosensitive cationic coating on the conductive coating.

The surface of the negative photosensitive cationic coating was directly irradiated with 5 mJ/cm$^2$ of argon laser beam (oscillating at 488 nm) to obtain a pattern (line/space= 50 $\mu$m/100 $\mu$m), so that the conductive coating would be formed into a desired electrode pattern when developed.

The cationic coating was developed by immersion in an acid developer (b) (1 wt. % aqueous acetic acid solution) at 25° C. for 60 seconds.

Then, revealed portions of the conductive coating were developed using the alkali developer (a) at 25° C.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the baked pattern had a good line shape. Also, the resulting conductive material coating (electrode coating) had a good volume resistivity of not higher than 10$^3$ $\Omega$.cm.

EXAMPLE 3

The conductive coating A was formed on a transparent glass plate in the same manner as in Example 1.

The aqueous positive photosensitive anionic composition 3 was applied by roller coating to the conductive coating A to a dry thickness of 6 $\mu$m, and cured by heating at 80° C. for 20 minutes to form a positive photosensitive anionic coating on the conductive coating.

The surface of the positive photosensitive anionic coating was directly irradiated with 5 mJ/cm$^2$ of argon laser beam (oscillating at 488 nm) to obtain a pattern (line/space=50 $\mu$m/100 $\mu$m), so that the conductive coating would be formed into a desired electrode pattern when developed.

Subsequently, exposed portions of the anionic coating and underlying portions of the conductive coating A were developed simultaneously by immersion in the alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than 10$^3$ $\Omega$.cm.

EXAMPLE 4

The conductive coating A was formed on a transparent glass plate in the same manner as in Example 1.

The aqueous positive photosensitive cationic composition 4 was applied by roller coating to the conductive coating A to a dry thickness of 6 $\mu$m, and dried at 80° C. for 20 minutes to form a positive photosensitive cationic coating on the conductive coating.

The surface of the positive photosensitive cationic coating was directly irradiated with 5 mJ/cm$^2$ of argon laser beam (oscillating at 488 nm) to obtain a pattern (line/space=50 $\mu$m/100 $\mu$m), so that the conductive coating would be formed into a desired electrode pattern when developed.

Exposed portions of the cationic coating were developed by immersion in the acid developer (b) at 25° C. for 60 seconds. Then, revealed portions of the conductive coating were developed by immersion in an alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than 10$^3$ $\Omega$.cm.

EXAMPLE 5

The conductive coating A was formed on a transparent glass plate in the same manner as in Example 1.

The organic solvent-based negative photosensitive cationic composition 5 was applied by roller coating to the conductive coating A to a dry thickness of 6 $\mu$m, and dried at 80° C. for 20 minutes to form a negative photosensitive anionic coating on the conductive coating.

The surface of the negative photosensitive cationic coating was directly irradiated with 5 mJ/cm$^2$ of argon laser beam (oscillating at 488 nm) to obtain a pattern (line/space= 50 $\mu$m/100 $\mu$m), so that the conductive coating would be formed into a desired electrode pattern when developed.

Subsequently, exposed portions of the anionic coating and underlying portions of the conductive coating A were developed simultaneously by immersion in the alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 6

The conductive coating A was formed on a transparent glass plate in the same manner as in Example 1.

The organic solvent-based negative photosensitive composition 6 was applied by roller coating to the conductive coating A to a dry thickness of 6 μm, and dried at 80° C. for 20 minutes to form a negative photosensitive cationic coating on the conductive coating.

The surface of the negative photosensitive cationic coating was directly irradiated with 5 mJ/cm$^2$ of argon laser beam (oscillating at 488 nm) to obtain a pattern (line/space= 50 μm/100 μm), so that the conductive coating would be formed into a desired electrode pattern when developed.

Subsequently, exposed portions of the cationic coating were developed by immersion in the acid developer (b) at 25° C. for 60 seconds, and then revealed portions of the conductive coating were developed by immersion in an alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 7

The conductive coating A was formed on a transparent glass plate in the same manner as in Example 1.

The organic solvent-based positive photosensitive composition 7 was applied by roller coating to the conductive coating A to a dry thickness of 6 μm, and dried at 80° C. for 20 minutes to form a positive photosensitive anionic coating on the conductive coating.

The surface of the positive photosensitive anionic coating was directly irradiated with 5 mJ/cm$^2$ of argon laser beam (oscillating at 488 nm) to obtain a pattern (line/space=50 μm/100 μm), so that the conductive coating would be formed into a desired electrode pattern when developed.

Subsequently, exposed portions of the anionic coating and underlying portions of the conductive coating A were removed simultaneously by immersion in the alkaline developer (a) at 25° C. for 60 seconds.

The developed coatings were allowed to stand at 45° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 8

The conductive coating A was formed on a transparent glass plate in the same manner as in Example 1.

The organic solvent-based positive photosensitive composition 8 was applied by roller coating to the conductive coating A to a dry thickness of 6 μm, and dried at 80° C. for 20 minutes to form a positive photosensitive cationic coating on the conductive coating.

The surface of the positive photosensitive cationic coating was directly irradiated with 5 mJ/cm$^2$ of argon laser beam (oscillating at 488 nm) to obtain a pattern (line/space=50 μm/100 μm), so that the conductive coating would be formed into a desired electrode pattern when developed.

Subsequently, exposed portions of the cationic coating were developed by immersion in the acid developer (b) at 25° C. for 60 seconds, and then revealed portions of the conductive coating were developed by immersion in an alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 9

The conductive coating A was formed on a transparent glass plate in the same manner as in Example 1.

The conductive coating was laminated with the negative dry film 1 in such a manner that the photosensitive surface of the dry film came in contact with the surface of the conductive coating, and then the polyethylene terephthalate release sheet was peeled off to form a negative photosensitive dry film on the conductive coating.

The surface of the negative photosensitive anionic coating was directly irradiated with 5 mJ/cm$^2$ of argon laser beam (oscillating at 488 nm) to obtain a pattern (line/space=50 μm/100 μm), so that the conductive coating would be formed into a desired electrode pattern when developed.

Subsequently, exposed portions of the anionic coating and underlying portions of the conductive coating A were developed simultaneously by immersion in the alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 10

The conductive coating A was formed on a transparent glass plate in the same manner as in Example 1.

The conductive coating was laminated with the negative dry film 2 in such a manner that the photosensitive surface of the dry film came in contact with the surface of the conductive coating, and the polyethylene terephthalate release sheet was peeled off to form a negative photosensitive dry film on the conductive coating.

The surface of the negative photosensitive cationic coating was directly irradiated with 5 mJ/cm$^2$ of argon laser beam (oscillating at 488 nm) to obtain a pattern (line/space= 50 μm/100 μm), so that the conductive coating would be formed into a desired electrode pattern when developed.

Then, exposed portions of the cationic coating were developed by immersion in the acid developer (b) at 25° C.

for 60 seconds, and then revealed portions of the conductive coating were developed by immersion in the alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 11

The conductive coating A was formed on a transparent glass plate in the same manner as in Example 1.

The conductive coating was laminated with the positive dry film 3 in such a manner that the photosensitive surface of the dry film came in contact with the surface of the conductive coating, and the polyethylene terephthalate release sheet was peeled off to form a positive photosensitive dry film on the conductive coating.

The surface of the positive photosensitive anionic coating was directly irradiated with 5 mJ/cm$^2$ of argon laser beam (oscillating at 488 nm) to obtain a pattern (line/space=50 μm/100 μm), so that the conductive coating would be formed into a desired electrode pattern when developed.

Subsequently, exposed portions of the anionic coating and underlying portions of the conductive coating A were developed simultaneously by immersion in the alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 12

The conductive coating A was formed on a transparent glass plate in the same manner as in Example 1.

The conductive coating was laminated with the positive dry film 4 in such a manner that the photosensitive surface of the dry film came in contact with the surface of the conductive coating, and the polyethylene terephthalate release sheet was peeled off to form a positive photosensitive dry film on the conductive coating.

The surface of the positive photosensitive cationic coating was directly irradiated with 5 mJ/cm$^2$ of argon laser beam (oscillating at 488 nm) to obtain a pattern (line/space=50 μm/100 μm), so that the conductive coating would be formed into a desired electrode pattern when developed.

Subsequently, exposed portions of the cationic coating were developed by immersion in the acid developer (b) at 25° C. for 60 seconds, and then revealed portions of the conductive coating were developed by immersion in the alkaline developer (a) at 25° C. for 60 seconds.

The developed coatings were allowed to stand at 450° C. for 30 minutes, heated and baked at 575° C. for 30 minutes to obtain a substrate having a pattern formed thereon. The pattern consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 13

A conductive material coating was obtained in the same manner as in Example 1 except that the conductive material B was used in place of the conductive material A, and that the temperature of the developer was changed to 20° C.

The obtained pattern on the substrate consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 14

A conductive material coating was obtained in the same manner as in Example 3 except that the conductive material B was used in place of the conductive material A and that the temperature of the developer was changed to 20° C.

The pattern on the substrate consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 15

A conductive material coating was obtained in the same manner as in Example 12 except that the conductive material B was used in place of the conductive material A, and that the temperature of the developer was changed to 20° C.

The pattern on the substrate consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 16

A conductive material coating was obtained in the same manner as in Example 1 except that the conductive material C was used in place of the conductive material A.

The pattern on the substrate consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 17

A conductive material coating was obtained in the same manner as in Example 1 except that the organic solvent-based heat-sensitive composition 1 was used in place of the aqueous negative photosensitive anionic composition 1, that a YAG laser was used in place of the argon laser, and that toluene was used as the developer for the heat-sensitive coating.

The pattern on the substrate consisted of well-remaining lines and well-developed spaces, and the pattern after baking had a good line shape. Also, the resulting conductive material coating (electrode coating) had a good volume resistivity of not higher than $10^3$ Ω.cm.

EXAMPLE 18

A conductive coating D was formed on a glass plate in the same manner as in Example 1 except that the conductive material D was used in place of the conductive material A.

The conductive coating D was laminated with the positive dry film 3 in such a manner that the photosensitive surface of the dry film came in contact with the surface of the conductive coating D, and then the polyethylene terephthalate release sheet was peeled off to form a positive photosensitive dry film on the conductive coating.

The surface of the positive dry film 3 was directly irradiated with 5 mJ/cm² of argon laser beam (oscillating at 488 nm), so that the conductive coating would be formed into a desired electrode pattern when developed.

Subsequently, exposed portions of the positive dry film 3 and underlying portions of the conductive coating D were developed simultaneously by immersion in the alkaline developer (a) at 25° C. for 60 seconds.

The developed coatings were heated at 160° C. for 30 minutes for curing the conductive coating. The pattern coating formed on the substrate remained well. Also, the resulting conductive material coating had a good volume resistivity of not higher than $10^3$ Ω.cm.

EXAMPLE 19

The positive dry film 4 was formed on the surface of the conductive coating D in the same manner as in Example 18.

The surface of the positive dry film 4 was directly irradiated with 5 mJ/cm² of argon laser beam (oscillating at 488 nm) to obtain a pattern (line/space=50 μm/100 μm), so that the conductive coating would be formed into a desired electrode pattern when developed.

Subsequently, exposed portions of the positive dry film 4 and underlying portions of the conductive coating D were developed simultaneously by immersion in the acid developer (b) at 25° C. for 60 seconds.

The developed coatings were heated at 160° C. for 30 minutes for curing the conductive coating. Further, the surface of the positive dry film 4 was irradiated with 5 mJ/cm² of argon laser beam (oscillating at 488 nm). The coatings were immersed in the acid developer (b) at 25° C. for 60 seconds to remove only the positive dry film. The pattern formed on the substrate consisted of well-remaining lines and well-developed spaces, and had a good line shape after baking. Also, the resulting conductive material coating (electrode coating) had a good volume resistivity of not higher than $10^3$ Ω.cm.

Comparative Examples 1 to 12

Conductive coatings of Comparative Examples 1 to 12 were prepared in the same manner as in Examples 1 to 12, respectively, except that the conductive material E was used in place of the conductive material A. The obtained coatings were evaluated in the same manner as in the Examples. As a result, the obtained conductive coatings consisted of poorly remaining lines and undeveloped spaces, and the coating after baking had an inferior line shape with partial breakage.

The method of the present invention is capable of forming a sharp conductive pattern without causing environmental problems.

Further, the method of the invention is applicable for various purposes, since the conductive coating-forming resin layer and the energy beam-sensitive coating layer on the substrate can be designed to have different functions.

What is claimed is:

1. A method of forming a conductive pattern, comprising the steps of:
   (1) depositing a first conductive coating-forming thermoplastic resin layer and a second positive photosensitive coating layer on a substrate;
   (2) irradiating the surface of positive photosensitive coating layer directly with a laser beam oscillating in the visible region, so as to obtain a desired pattern; and
   (3) developing the positive photosensitive coating layer and the conductive coating-forming thermoplastic resin layer simultaneously;
   wherein the conductive coating-forming thermoplastic resin layer has a glass transition temperature higher than the temperature of the development of the resin layer.

2. The method according to claim 1, wherein the conductive coating-forming thermoplastic resin layer contains a resin for development which imparts to the resin layer a glass transition temperature higher than the temperature for the development of the resin layer.

3. The method according to claim 1, wherein the conductive coating-forming thermoplastic resin layer comprises
   a conductive material,
   a thermoplastic resin, and
   an inorganic powder fusible by heat;
   the method further comprising the step of baking by heating the conductive coating-forming thermoplastic resin layer after development.

4. The method according to claim 1, wherein the positive photosensitive coating layer comprises a liquid resist or a dry resist film.

* * * * *